(12) United States Patent
Kitagawa

(10) Patent No.: US 6,877,668 B1
(45) Date of Patent: Apr. 12, 2005

(54) MARKING METHOD FOR SEMICONDUCTOR WAFER

(75) Inventor: Satoshi Kitagawa, Kanagawa (JP)

(73) Assignee: Komatsu Electronic Metals Co., Ltd. (JP)

(*) Notice: Subject to any disclaimer, the term of this patent is extended or adjusted under 35 U.S.C. 154(b) by 159 days.

(21) Appl. No.: 09/696,117

(22) Filed: Oct. 25, 2000

(30) Foreign Application Priority Data

Oct. 26, 1999 (JP) .............................. 11-304700
Oct. 26, 1999 (JP) .............................. 11-304701

(51) Int. Cl.[7] .............................................. G06K 19/06
(52) U.S. Cl. ......................................................... 235/494
(58) Field of Search .......................... 235/494; 355/43, 355/53; 430/13; 257/620

(56) References Cited

U.S. PATENT DOCUMENTS 6,004,405 A * 12/1999 Oishi et al. ................. 148/33.2
6,268,641 B1 * 7/2001 Yano et al. .................. 257/618
6,312,876 B1 * 11/2001 Huang et al. ................ 430/313

FOREIGN PATENT DOCUMENTS

| JP | 59-23512 | 2/1984 |
| JP | 2-175154 | 7/1990 |
| JP | 3-116919 | 5/1991 |
| JP | 3-256314 | 11/1991 |
| JP | 4-133425 | 12/1992 |
| JP | 08-335537 | 12/1996 |
| JP | 2000-223380 | 8/2000 |

* cited by examiner

Primary Examiner—Thien M. Le
Assistant Examiner—Lisa M. Caputo
(74) Attorney, Agent, or Firm—Welsh & Katz, Ltd.

(57) ABSTRACT

A plurality of minute ID marks are inscribed on a semiconductor wafer which is under manufacture, without imposing adverse effect to the wafer, in order to make the marks less susceptible to surface treatment to be performed during the course of manufacture. Further, the minute ID marks act as mutual backups. Inscribing such minute ID marks on a semiconductor wafer prevents confusion due to effacement of ultra-minute marks and eliminates worry about the impossibility of tracing a semiconductor wafer.

16 Claims, 6 Drawing Sheets

MARKING METHOD FOR SEMICONDUCTOR WAFER

BACKGROUND OF THE INVENTION

1. Field of the Invention

The present invention relates to a method for appropriately marking a semiconductor wafer in order to enable correct identification of the semiconductor wafer, as well as to a semiconductor wafer marked by said method.

2. Background Art

In the event failures are found to have arisen during the course of manufacture or after shipment of semiconductor wafers, such as silicon wafers, accurate reporting of the failures to a manufacturing facility is very important for determining sources of the failures without fail.

In order to enable such feedback, individual wafers which are under manufacture must be identifiable. To this end, individual semiconductor wafers are marked at initial stages in the process of manufacture.

Marking of semiconductor wafers is usually implemented, by means of making a certain impression on specified locations of individual wafers which are under manufacture. In order to achieve this, a laser marking machine (described in, for example, Japanese Patent Application Laid-Open Nos. 23512/1984 and 175154/1990), for example, is used.

A typical mark to be inscribed on an individual wafer is an ID number. There may be a case where a mark, such as a bar code, a character, or a numeral, is inscribed on the surface of a wafer as information about processing conditions, processing history, or electrical properties. In this case, a mark can be used for process and production control, as well as for tracing the source and route of failures. Consequently, wafers can be identified during the course of manufacture or after shipment.

A marking operation involves application of any physical action to a wafer which is under manufacture. For this reason, there may arise a case where slips arise in a wafer for reasons of marking operation. In order to prevent an adverse effect on a wafer, which would otherwise be imposed by a marking operation, marking a wafer on the smallest possible scale is preferable.

Inscription of a minute mark is preferable in terms of protection of a wafer from an adverse effect. However, a minute mark is easily effaced by surface treatment to which a semiconductor wafer is to be subjected during the course of manufacturing process. Needless to say, manufacture of semiconductor wafers is incessantly performed on a production line. If a semiconductor wafer whose mark is effaced is mingled with other semiconductor wafers, finding the semiconductor wafer and restoring the thus-found wafer to its original condition is very difficult.

The present invention has been conceived in light of the foregoing problems and is aimed at providing a method of inscribing marks on a semiconductor wafer, which marks are less susceptible to surface treatment performed during the course of manufacture, as well as a semiconductor wafer for distribution.

SUMMARY OF THE INVENTION

To solve the above-described drawbacks, the present invention provides a marking method for inscribing a plurality of minute ID marks on a wafer which function as mutual backups.

Preferably, identical marks are formed in two or more locations on a semiconductor wafer for distribution purpose. These marks act as backup marks such that, if one of the marks is effaced, the remaining mark(s) acts as a backup. Even in a case where one of the marks is effaced by means of surface treatment to which the semiconductor wafer is to be subjected to during the course of manufacture, the original mark can be immediately and correctly restored.

More specifically, the present invention is to provide the followings:

(1) A method of reproducing a mark on a semiconductor wafer, wherein, in a case where a predetermined mark which has been made on a semiconductor wafer beforehand during the course of manufacture or processing is substantially effaced in association with progress of manufacturing operation or processing operation, a mark essentially identical with the substantially-effaced mark is formed at another location spaced apart from the substantially-effaced mark.

(2) A method of reproducing a mark on a semiconductor wafer, wherein, in a case where any one of predetermined single essentially-identical marks which have been made in two or more locations on a semiconductor wafer beforehand during the course of manufacture or processing is substantially effaced in association with progress of manufacturing operation or processing operation, a mark essentially identical with the substantially-effaced mark is reproduced by reference to the substantially-remaining other mark.

(3) The method of reproducing a mark on a semiconductor wafer according to (2), wherein the substantially-effaced mark is reproduced by means of forming a mark essentially identical with the substantially-effaced mark at another location spaced apart from the substantially-effaced mark.

(4) The method of reproducing a mark on a semiconductor wafer according to (1) or (3), wherein the another location corresponds to a location in the vicinity of the substantially-effaced mark.

(5) The method of reproducing a mark on a semiconductor wafer according to (4), wherein the predetermined mark is formed by means of a combination of dots, each dot measuring 1 to 13 $\mu$m.

(6) The method of reproducing a mark on a semiconductor wafer according to (5), wherein the predetermined mark is a minute ID mark.

(7) The method of reproducing a mark on a semiconductor wafer according to (6), wherein the predetermined mark is a mark affixed on the interior wall surface of a notch.

(8) A semiconductor wafer for distribution purpose having two or more essentially-identical marks formed thereon.

(9) The semiconductor wafer for distribution purpose according to (8), wherein two or more essentially-identical marks are provided at positions where the marks are to undergo the same surface treatment at different speeds during the course of manufacture.

(10) The semiconductor wafer for distribution purpose according to (9), wherein two or more essentially-identical marks are provided on the front side of the semiconductor wafer and the other identical marks are provided on the reverse side of the same.

(11) The semiconductor wafer for distribution purpose according to (10), wherein two or more essentially-identical marks are provided close to each other.

(12) The semiconductor wafer for distribution purpose according to any one of (8) through (10), wherein two or more essentially-identical marks are provided within an area where a single optical reading machine can read the marks simultaneously.

(13) The semiconductor wafer for distribution purpose according to anyone of (8) through (12), wherein two or more essentially-identical marks are formed by means of a combination of dots, each dot measuring 1 to 13 μm.

(14) The semiconductor wafer for distribution purpose according to (13), wherein the marks are ID marks.

(15) The semiconductor wafer for distribution purpose according to (13) or (14), wherein the predetermined marks are affixed on the interior wall surface of a notch.

(16) The semiconductor wafer for distribution purpose according to (13), wherein the marks are for positioning purpose.

(17) The semiconductor wafer for distribution purpose according to (13), wherein the marks are provided for suggesting crystal orientation of the semiconductor wafer.

(18) The semiconductor wafer for distribution purpose according to (16) or (17), wherein the semiconductor wafer is perfectly annular.

(19) A wafer carrier storing the semiconductor wafers for distribution purpose defined in (12) while the marks are aligned with each other.

(20) Use of a semiconductor wafer on which two or more essentially-identical marks are formed by means of marking the semiconductor wafer during the course of manufacture or processing.

(21) A method of obviating a demerit, which would otherwise be caused when a single mark is substantially effaced in association with manufacture or processing of a semiconductor wafer, by means of marking a semiconductor wafer with two or more essentially-identical marks during the course of manufacture or processing.

In connection with the concept regarding "processes for manufacturing or processing a semiconductor wafer," the expression "process for manufacturing a semiconductor wafer" used herein encompasses all processes pertaining to manufacture of a semiconductor wafer. Further, the expression "process for processing a semiconductor wafer" encompasses all processes pertaining to processing of a semiconductor wafer manufactured by way of the semiconductor wafer manufacturing process, such as a process of processing into a semiconductor device a semiconductor wafer manufactured by way of the semiconductor wafer manufacturing process.

The expression "substantially effaced" and the expression "substantial effacement" encompass a case where a mark is not effaced completely but is difficult to detect or read, as well as a case where a mark is completely effaced. Further, the expression "effacement" used herein often means a case where a mark is not effaced completely but is difficult to detect or read, as well as a case where a mark is completely effaced.

The expression "substantially identical mark" is a concept encompassing not only a completely identical mark, but also a mark which is identical with respect to a portion required for identifying a semiconductor wafer but which differs in other respects, such as an additional portion. For instance, such a mark corresponds to a mark which is identical with respect to portions expressing a lot number and a serial number assigned to a semiconductor wafer but which differs with respect to only a portion expressing the number of times the mark is reproduced.

The present embodiment includes a case where a substantially-remaining mark is fully copied to another location, as well as a case where a portion required for identifying a semiconductor wafer is extracted from a substantially-remaining mark, an additional portion is changed, as required, and the mark is inscribed at another location along with the thus-changed additional portion.

The expression "predetermined mark" typically designates an ID number assigned to an individual wafer. Further, the expression covers a mark expressing the processing history of a wafer, such as a bar code, a character, or a numeral. Further, the expression "predetermined mark" may correspond to a registered trademark.

The expression "substantially effaced" means a case where a mark is effaced to such an extent that the mark is difficult to detect or read, as well as a case where a mark is completely effaced.

The present invention is aimed at processing a wafer. Here, processing of a wafer can be carried out without regard to the constituent components of a wafer. The object of the present invention is not limited to a silicon wafer; the present invention can be applied to wafers of all types and forms; for example, wafers made of different raw materials such as compound semiconductor wafers; wafers produced by way of different processes such as nitrogen-doped wafers; and wafers which have been subjected to special treatment such as epitaxial wafers which are sliced after having been epitaxially grown.

The expression "semiconductor wafer for distribution purpose" means a semiconductor wafer which is used not only for test or research purposes but also for commercial circulation.

The expression "front and reverse" signifies respective surfaces of a wafer having an edge therebetween. The expression "front side" means a front surface as well as a front bevel surface, and the expression "reverse side" means a reverse surface as well as a reverse bevel surface.

The expression "perfect annular wafer" means a wafer devoid of a notch or an orientation flat.

DETAILED DESCRIPTION OF THE PREFERRED EMBODIMENT

A preferred embodiment of the present invention will be described hereinbelow by reference to the accompanying drawings.

[Marking Machine]

All marking machines which are currently available can be used for implementing a marking method according to the present invention. In the present embodiment, a laser marking machine is taken as a typical example.

Figure 1:
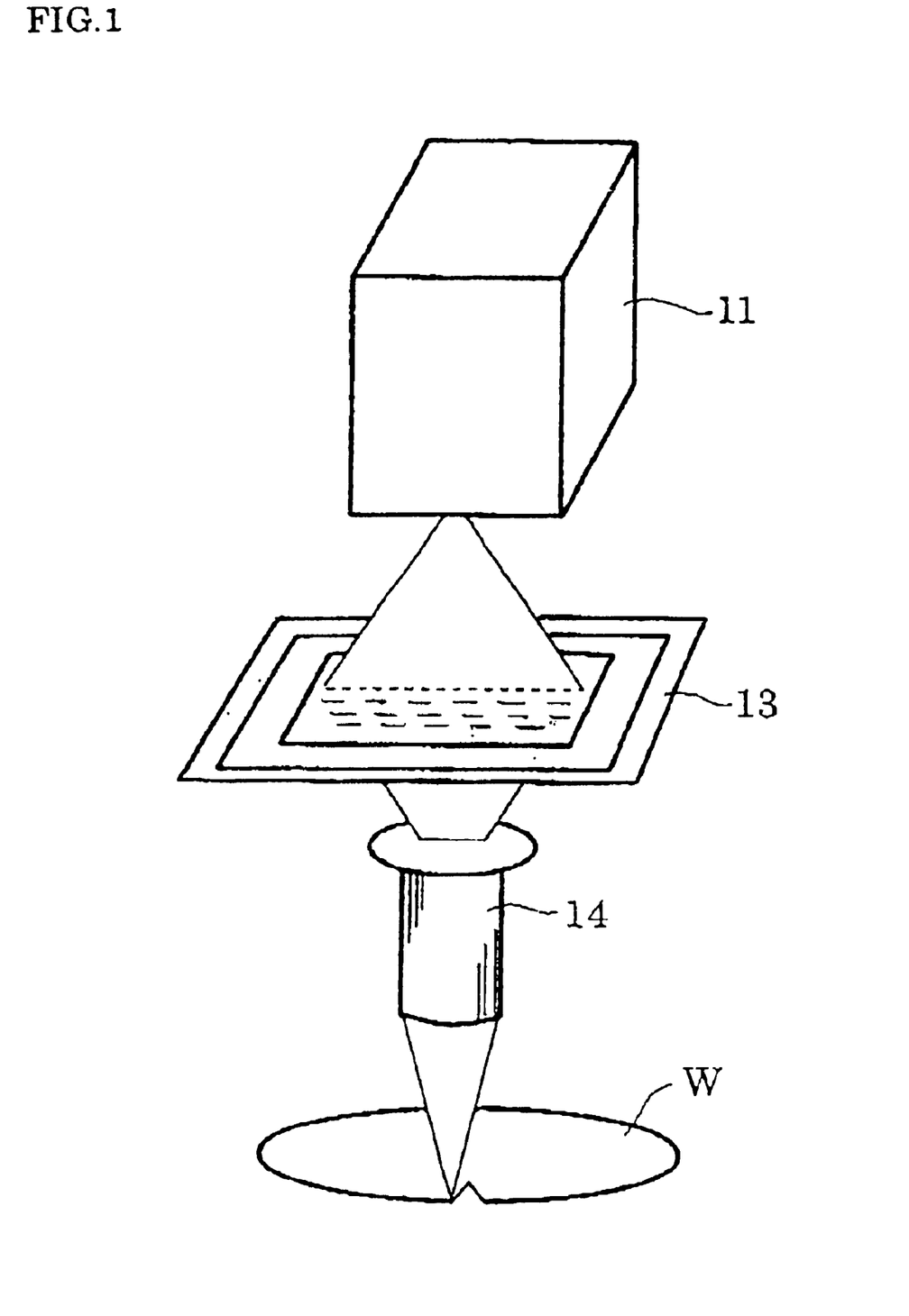
FIG. 1 shows the functional construction of a common laser marking machine.

As shown in FIG. 1, a laser marking machine is usually equipped with an optical element 11 consisting of a laser-beam inlet optical system and a lens for defining a mask geometry; a liquid-crystal mask 13; and a projection lens 14 which guides a laser beam to a wafer W and forms the image of the liquid-crystal mask 13 at a predetermined location on the wafer W.

In such a laser marking machine, the position of projection of the projection lens 14 is adjusted, to thereby produce an image corresponding to a desired mark on the liquid-crystal mask 13. The liquid-crystal mask 13 is exposed to a laser beam, wherewith a desired mark can be made on the wafer W.

A laser marking machine described in Japanese Patent Application Laid-Open No. 19737/1999 is particularly preferable, because it can make a ultra-minute mark.

[Reading Machine]

A mark made on the wafer W by means of such a laser marking machine is read by a reading machine.

Figure 2:
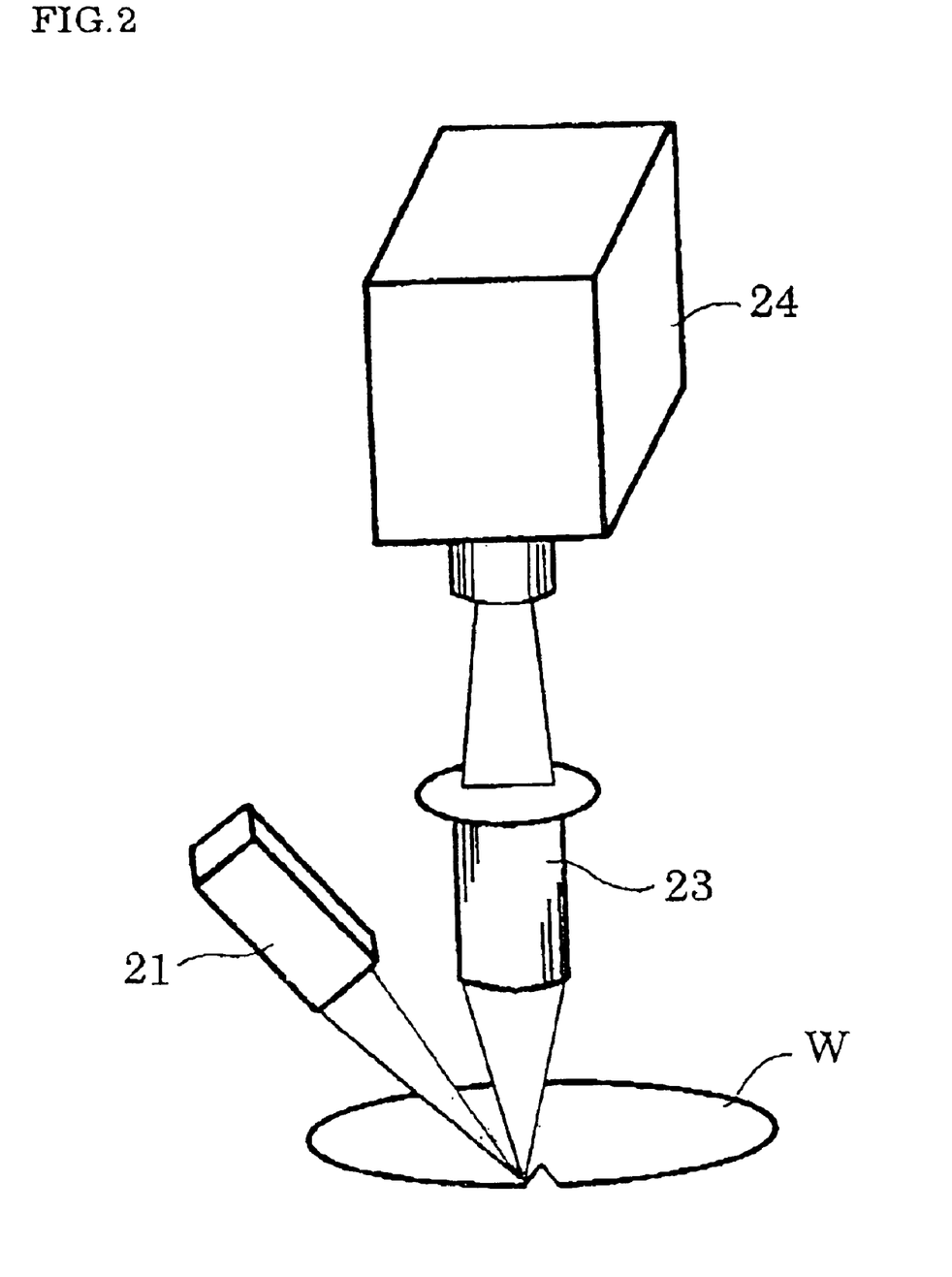
FIG. 2 shows the functional construction of a common reading machine.

As shown in FIG. 2, a popular reading machine radiates a laser beam originating from a light source 21 onto a mark inscribed on the wafer W, and light reflected by the mark is focused to produce an image by way of an imaging lens 23. The thus-formed image is detected by a camera 24, as a result of which the mark on the wafer W is read.

Figure 3:
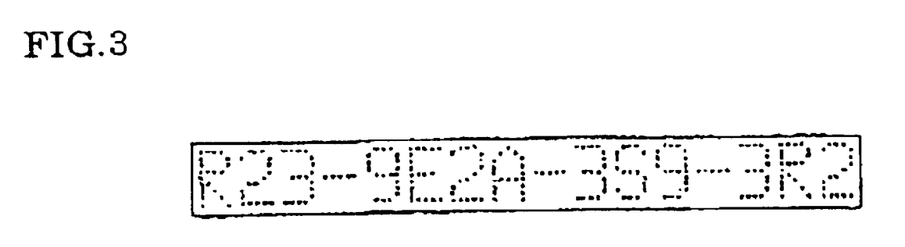
FIG. 3 is an example of a mark.

The mark on the wafer W corresponds to, for example, a mark such as that shown in FIG. 3. The reading machine shown in FIG. 2 reads the mark.

[Marking Position]

Figure 4:
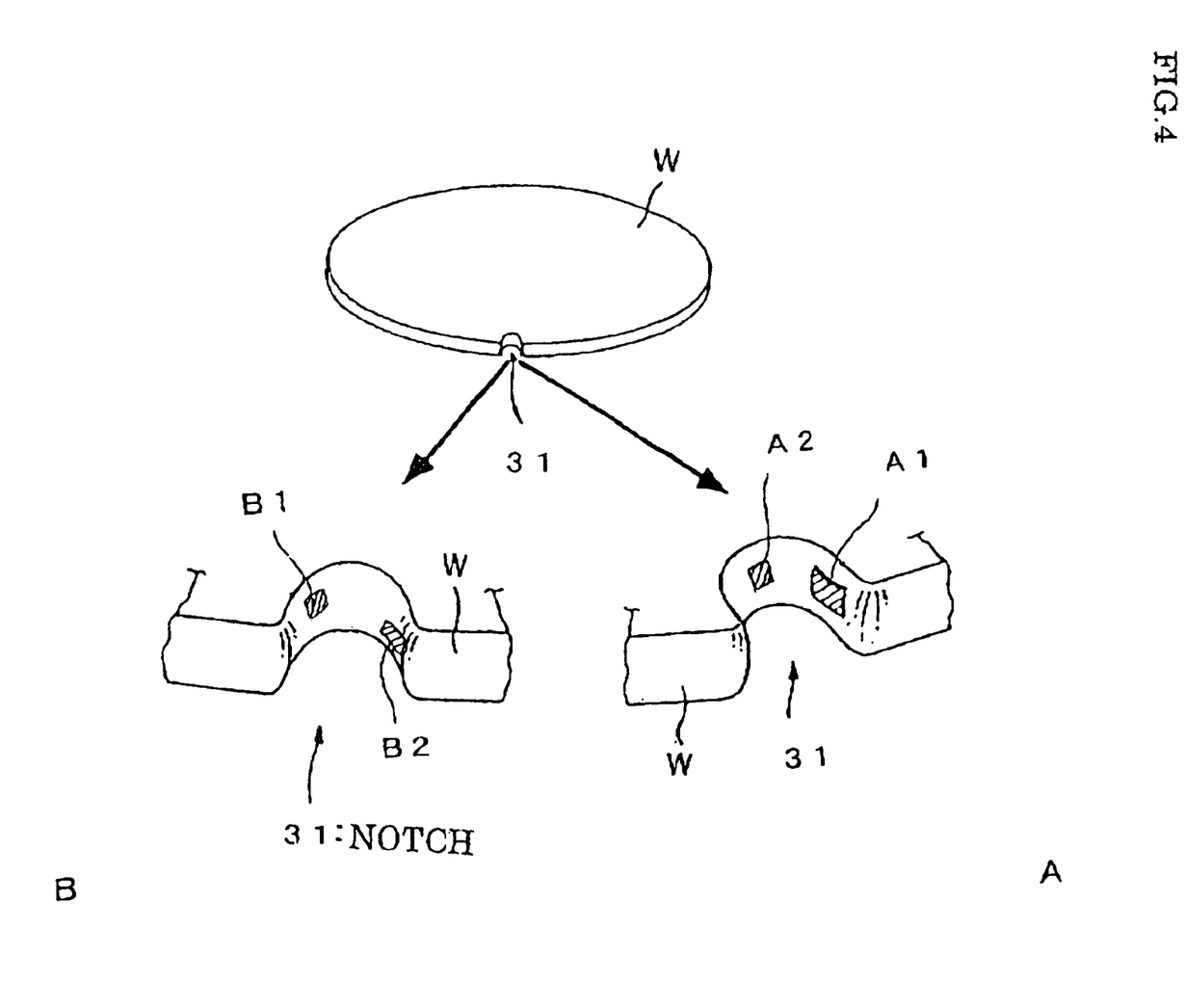
FIGS. 4A and 4B are illustrations for describing marking locations.

As shown in FIG. 4, in the present embodiment, marks are affixed on two locations on the interior wall surface of a notch 31 of the wafer W (A1 and A2 shown in FIG. 4A or B1 and B2 shown in FIG. 4B).

Figure 5:
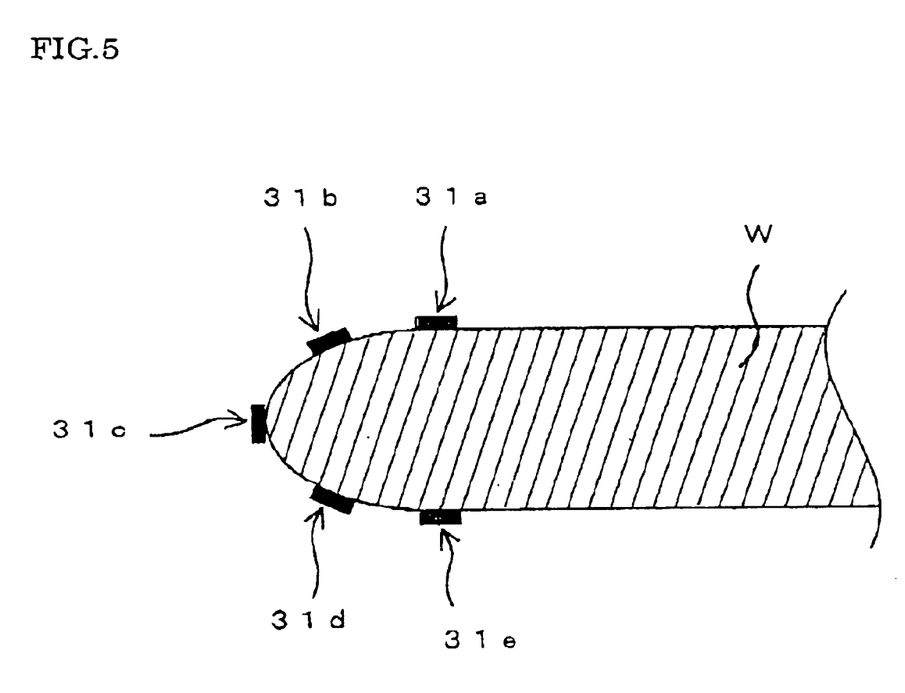
FIG. 5 is an enlarged cross-sectional view for describing marking positions.

FIG. 5 is an enlarged cross-sectional view of the wafer W. As illustrated, there are five candidate making locations; a front surface 31a; a front bevel surface 31b; an edge 31c; a reverse bevel surface 31d; and a reverse surface 31e. Two marks A1 and A2 shown in FIG. 4A differ in location from each other with reference to the circumferential direction of the notch 31. Further, mark A1 is formed on a front bevel surface, and mark A2 is formed on an edge. Thus, marks A1 and A2 differ in level with reference to the vertical direction.

Similarly, of two marks B1 and B2 shown in FIG. 4B, mark B1 is formed on a front bevel surface, and mark B2 is formed on a reverse bevel surface.

As will be stated in connection with an example which will be described later, in a case where a wafer is to be subjected to surface treatment during the course of manufacture, a difference exists between a mark printed on the front surface of a wafer and a mark printed on a front bevel surface of a wafer, as well as between a mark printed on the front surface of a wafer and a mark printed on the reverse surface of a wafer, in terms of an extent to which a mark is effaced. It is also admitted that effacement of a mark changes according to types of manufacturing processes to which a wafer is to be subjected.

According to the present invention, two or more marks are made on a wafer which act as mutual backup. If one of the two or more marks is completely effaced or effaced to such an extent that a reading machine cannot read the mark, another mark identical with the remaining mark is newly inscribed on a wafer, thus restoring the wafer to its original condition.

Thus, the present invention prevents occurrence of a problem, such as loss of a wafer or the impossibility of tracing a wafer, which would otherwise be caused when a mark is effaced during the course of manufacture, by means of constantly ensuring two or more marks on a wafer.

[Marked Wafer]

The above embodiment describes an example in which two marks are made on a wafer. However, three or more marks may also be formed.

Figure 6A:
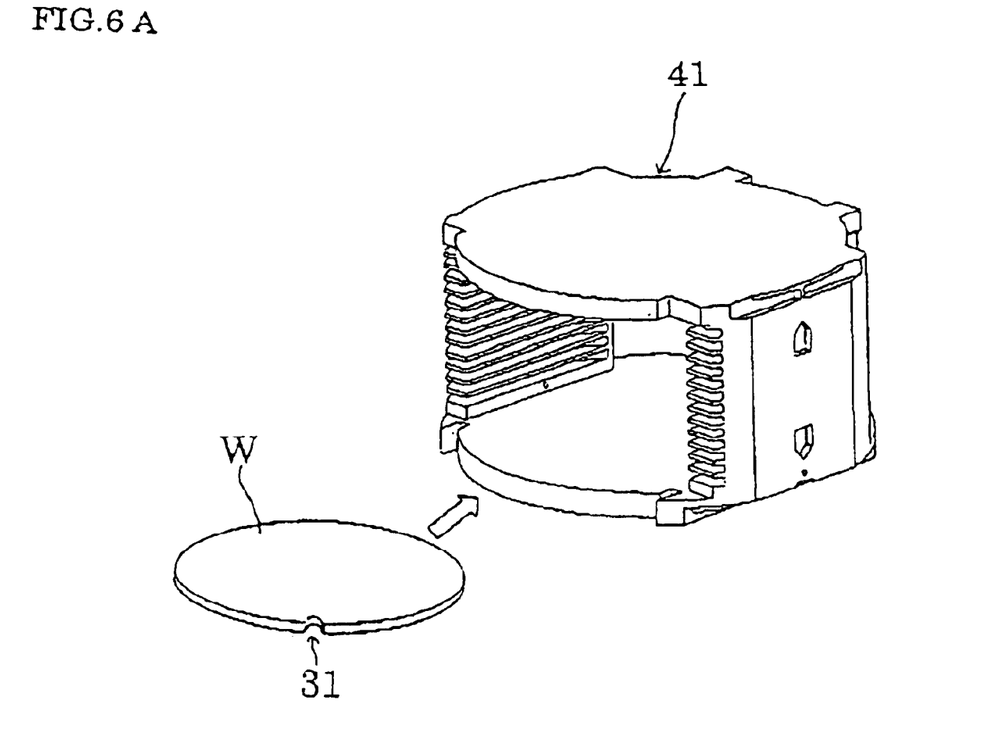
FIGS. 6A and 6B are illustrations for describing storage of wafers in a wafer carrier.
Figure 6B:
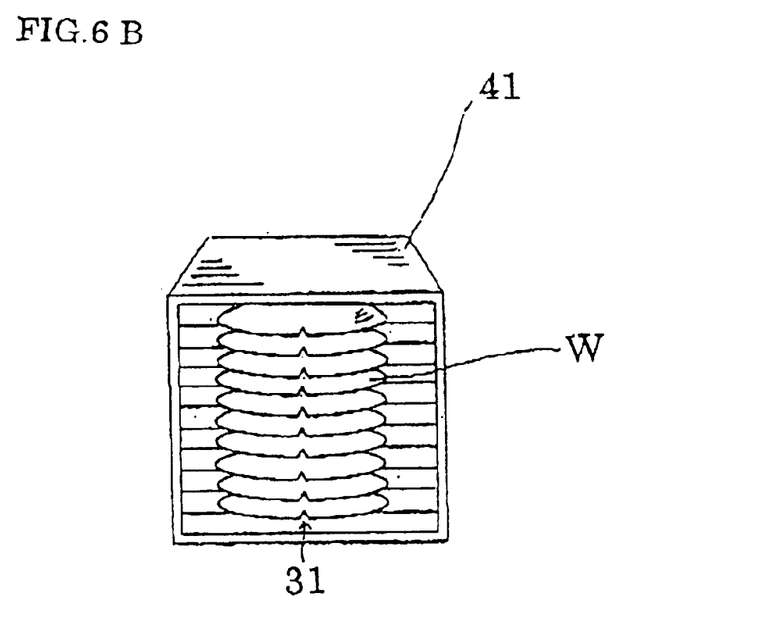

So long as a plurality of marks are formed within a narrow area where a single reading machine can read these marks simultaneously, detection efficiency is improved. Concentration of marks in a narrow area is also preferable in terms of improvement in processing efficiency. In a case where a plurality of wafers W are stored in a wafer carrier 41 for transportation, aligning positions of marks on wafers W is preferable, for the same reasons (FIGS. 6A and 6B).

In a case where a mark identical with an original mark which has been effaced is newly made on a wafer in order to restore the original mark, if the original mark remains incompletely effaced, making a new mark on another location spaced apart from the location of the original mark is preferable, in order to prevent occurrence of interference which would otherwise arise between the original mark and the new mark. At that time, if the new mark is formed in a position spaced apart from the original mark and in the vicinity thereof, the new mark can stay within the view field of the reading machine.

EXAMPLE

Identical marks having a width of 320 μm were formed on the front and front bevel surfaces of a wafer W, the front and reverse bevel surfaces of an interior of a notch, and the reverse bevel surface of the interior of the notch. After formation of a thin copper film of 1 μm thickness on the wafer W, the wafer W was subjected to CMP (chemical-and-mechanical polishing). The extent to which marks were effaced (i.e., the extent to which marks remain) was observed twice; i.e., after formation of the thin copper film and after CMP.

Observation results are provided in Table 1.

TABLE 1

| | AFTER FORMATION OF THIN COPPER FILM OF 1 μm THICKNESS | AFTER CMP BY 0.75 μm |
|---|---|---|
| FRONT SURFACE | CLEARLY READABLE | COMPLETELY EFFACED |
| FRONT BEVEL SURFACE | DIFFICULT TO READ | DIFFICULTY TO READ |
| FRONT BEVEL SURFACE OF INTERIOR OF NOTCH | CLEARLY READABLE | SLIGHTLY DIFFICULT TO READ |
| REVERSE BEVEL SURFACE | CLEARLY READABLE | CLEARLY READABLE |
| REVERSE BEVEL SURFACE OF INTERIOR NOTCH | CLEARLY READABLE | CLEARLY READABLE |

As can be seen from the observation results provided in Table 1, after the wafer W has been subjected to CMP, both the mark on the front bevel surface of the notch and the mark on the reverse bevel surface of interior of the notch remain readable well, regardless of whether the marks are present on the exterior or interior of the notch. In a case where the mark on the reverse side of the notch has been effaced by debris on the reverse side, the mark on the front surface acts as a backup mark.

So long as a mark on the front bevel surface and the mark on the reverse bevel surface are sufficiently close to each other with reference to the circumferential direction of the notch, regardless of whether the marks are present on the interior or exterior of the notch, the marks can sufficiently fall within a single view field of a camera. Thus, even when a plurality of marks are located within an area where they back each other up, a single camera can observe the marks simultaneously.

In a semiconductor wafer according to the present invention, a plurality of marks are formed for mutual backup. Therefore, even in a case where ultra-minute marks are made on a semiconductor wafer, there can be prevented confusion due to effacement of a mark and there can be eliminated worry about the impossibility of tracing a semiconductor wafer.

What is claimed is:

1. A method of reading a mark on a semiconductor wafer, comprising the steps of:
   forming a first mark capable of identifying said wafer, said first mark being separate and distinct from a second mark, each of said first and second marks having an identical content and being in an identical format on an interior wall of a notch of each of a plurality of said semiconductor wafers;
   storing the plurality of semiconductor wafers in a wafer carrier by aligning said notches; and
   simultaneously reading the first and second marks on the interior wall of said notch by an optical reader.

2. The method of reading a mark on a semiconductor wafer according to claim 1, wherein the second mark is reproduced by means of forming said second mark identical to the mark at a second location spaced apart from the first mark.

3. The method of reading a mark on a semiconductor wafer according to claim 1, wherein the first mark is reproduced by means of forming a second mark identical to the first mark at a second location in the vicinity of the first mark.

4. The method of reading a mark on a semiconductor wafer according to claim 1, wherein the second mark is formed by means of a combination of dots, each dot measuring 1 to 13 $\mu$m wide, and the first mark is reproduced by means of forming a second mark identical to the first mark at a second location in the vicinity of the first mark.

5. The method of reading a mark on a semiconductor wafer according to claim 1, wherein the second mark is a minute ID mark which is assigned to the semiconductor wafer and is formed by means of a combination of dots, each dot measuring 1 to 13 $\mu$m wide, and the first mark is reproduced by means of forming a second mark identical to the first mark at a second location in the vicinity of the first mark.

6. The method of claim 1 further including the step of providing said first ad second marks at positions where the marks are to undergo the same surface treatment at different speeds during the course of manufacture.

7. The method of claim 1 further including the step of providing said first and second marks on the front side of the semiconductor wafer and a third mark on the reverse side of said semiconductor wafer, such that the first, second and third marks undergo the same surface treatment at different speeds during the course of manufacture.

8. The method of claim 1 further including the step of providing said first and second marks on the front side of the semiconductor wafer and a third mark on the reverse side of said semiconductor wafer, such that the first, second and third marks are located close to each other and such that the first, second and third marks undergo the same surface treatment at different speeds during the course of manufacture.

9. The method of claim 1 further including the step of providing said first and second marks on the front side of the semiconductor wafer and a third mark on the reverse side of said semiconductor wafer, such that the first, second and third marks under go the same surface treatment at different speeds during the course of manufacture and such that the first, second and third marks are located within an area where a single optical reading machine can read the first, second and third marks simultaneously.

10. The method of claim 1 further including the step of forming the first and second marks by means of a combination of dots, each dot measuring 1 to 13 $\mu$m wide, and providing said first and second marks on the front side of the semiconductor wafer and a third mark is provided on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

11. The method of claim 1 further including the step of assigning said first and second marks ID marks to the semiconductor wafer as a combination of dots, each dot measuring 1 to 13 $\mu$m wide, providing said first mark on the front side of the semiconductor wafer and said third mark identical to said first and second marks on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

12. The method of claim 1 further including the step of assigning ID marks to said first and second marks to the semiconductor wafer, and forming said ID marks by a combination of dots, each dot measuring 1 to 13 $\mu$m, affixing said ID marks on the interior wall surface of a notch, and providing said first mark on the front side of the semiconductor wafer and a third mark identical to said first and second marks on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

13. The method of claim 1 further including the steps of forming said first and second marks by means of a combination of dots, each dot measuring 1 to 13 $\mu$m for positioning purpose, and providing said first and second marks on the front side of the semiconductor wafer and a third mark identical to said first and second mark on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

14. The method of claim 1 further including the steps of forming first and second marks by means of a combination of dots, each dot measuring 1 to 13 $\mu$m and indicating a crystal orientation of the semiconductor wafer, and providing said first and second marks on the front side of the semiconductor wafer and a third mark identical to said first and second marks on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

15. The method of claim 1 wherein the semiconductor wafer is perfectly annular; and including the steps of forming first and second identical marks by means of a combination of dots, each dot measuring 1 to 13 $\mu$m and indicating crystal orientation of the semiconductor wafer; and providing said first and second mark on the front side of the semiconductor wafer and providing a third mark identical to said first and second marks on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

16. The method of claim 1 further including the steps of aligning said first and second marks in a single direction; and providing said first and second marks on the front side of the semiconductor wafer and providing a third mark identical to said first and second marks on the reverse side of said semiconductor wafer, such that the first, second and third marks undergo the same surface treatment at different speeds during the course of manufacture and such that the first, second and third marks are located within an area where a single optical reading machine can read the first, second and third marks simultaneously.

* * * * *